United States Patent [19]

Miller

[11] Patent Number: 4,551,674
[45] Date of Patent: Nov. 5, 1985

[54] NONCONTACTING CONDUCTIVITY TYPE DETERMINATION AND SURFACE STATE SPECTROSCOPY OF SEMICONDUCTOR MATERIALS

[75] Inventor: Gabriel L. Miller, Westfield, N.J.

[73] Assignee: AT&T Bell Laboratories, Murray Hill, N.J.

[21] Appl. No.: 441,366

[22] Filed: Nov. 12, 1982

[51] Int. Cl.[4] .............................................. G01R 31/26
[52] U.S. Cl. ............................. 324/158 R; 324/158 D
[58] Field of Search ........... 324/158 R, 158 D, 158 T, 324/60 C, 60 R

[56] References Cited

U.S. PATENT DOCUMENTS

| | | | |
|---|---|---|---|
| 3,748,579 | 7/1973 | Henry et al. | 324/158 D |
| 3,919,639 | 11/1975 | Graffe et al. | 324/158 R |
| 4,190,799 | 2/1980 | Miller | 324/239 |
| 4,286,215 | 8/1981 | Miller et al. | 324/158 R |
| 4,333,051 | 6/1982 | Goodman | 324/158 R |

FOREIGN PATENT DOCUMENTS

| | | | |
|---|---|---|---|
| 547871 | 10/1957 | Canada | 324/158 D |
| 761592 | 6/1967 | Canada | 324/158 D |
| 55-36722 | 3/1980 | Japan | 324/60 R |
| 197805 | 5/1978 | United Kingdom | 324/60 C |
| 245206 | 5/1970 | U.S.S.R. | 324/60 R |
| 442398 | 12/1974 | U.S.S.R. | 324/158 D |
| 512440 | 1/1977 | U.S.S.R. | 324/60 C |
| 699455 | 12/1979 | U.S.S.R. | 324/158 D |

OTHER PUBLICATIONS

Journal of Applied Physics, Stevenson, "Measurement of Carrier Lifetimes in Germanium and Silicon", vol. 26, No. 2, Feb. 1955, pp. 190–195.

Ann. Rev. Mater. Sci., Miller, G. L., et al., "Capacitance Transient Spectroscopy", 1977, pp. 377–448.

Sov. J. Quantum Electron, Burbaev, T. M. et al., "Phase Method for the Determination of the Lifetime of Nonequilibrium Carriers . . . ", vol. 9, No. 10, Oct. 1979, pp. 1293–1296.

The Electrochemical Society Proceedings, Miller, G. L. et al., "Nondestructive Electrical Test Methods . . . ", vol. 78-3, 1978, pp. 1–31.

Proceedings of the 2nd ISPRA Nuclear Electronics Symposium, Miller, G. L. et al., "Transversal Filters for Pulse Spectroscopy", May 1975, pp. 9–19.

Instruments and Experimental Techniques, Kashnikov, B. P., "Cold Thermal Probe", vol. 19, No. 2, Pt. 2, Mar. 1976, p. 575.

Review of Scientific Instruments, Hakansson, H., "Conductivity Type Determination for Different Semiconductor Materials", vol. 43, No. 9, Sep. 1976, pp. 1380–1381.

Solid State Technology, Yeager, J. R., "Semiconductor Resistivity and Conductivity Type Determination", Mar. 1974, pp. 14–16.

(List continued on next page.)

*Primary Examiner*—Stewart J. Levy
*Assistant Examiner*—Stephen M. Baker
*Attorney, Agent, or Firm*—Eugen E. Pacher

[57] ABSTRACT

Disclosed is a capacitive, preferably noncontacting, photovoltaic method for conductivity type determination of a semiconductor sample, including of a thin epitaxial layer on a substrate, and a related method that can advantageously be used for surface state spectroscopy of semiconductors. The type-determination method comprises comparing the phase of a signal, obtained capacitively by maintaining an electrode in close proximity with an appropriately illuminated semiconductor surface region, with the phase of a reference signal at the illumination modulation frequency. The phase relationship between signal and reference signal indicates the conductivity type of the semiconductor. A preferred embodiment of the method, comprising an operational amplifier integrator, can be advantageously used for surface state spectroscopy, since, inter alia, the observed signal is substantially independent of the sample/electrode spacing.

15 Claims, 8 Drawing Figures

OTHER PUBLICATIONS

Journal of Applied Physics, Goodman, A. M., "A Method for the Measurement of Short Minority Carrier Diffusion Lengths in Semiconductors", vol. 32, No. 12, Dec. 1961, pp. 2550-2552.

1981 Annual Book of ASTM Standards, "Minority Carrier Diffusion Length in Silicon by Measurement of Steady-State Surface Photovoltage", 1981, pp. 795-801.

Physics of Semiconductor Devices, 2nd ed., Sze, S. M., 1981, pp. 750-751.

Rep. Prog. Physics, Blood, P. et al., "The Electrical Characterization of Semiconductors", vol. 41, 1978, pp. 11-252.

Evrenidis, et al., "Detecting Insulator Surface Charge", IBM Technical Disclosure Bulletin, vol. 13, No. 9, Feb. 1971, p. 2797.

NONCONTACTING CONDUCTIVITY TYPE DETERMINATION AND SURFACE STATE SPECTROSCOPY OF SEMICONDUCTOR MATERIALS

FIELD OF THE INVENTION

This invention pertains to the field of characterization of semiconductor materials, in particular, to the field of noncontacting characterization methods.

BACKGROUND OF THE INVENTION

Accurate characterization of semiconductor materials is of critical importance in the manufacture of semiconductor devices, since device performance typically is strongly dependent on such material parameters as carrier density, mobility, and lifetime, and on defect state density. Much effort has been expended in the past on developing semiconductor material characterization techniques, and a great variety of such techniques exist today. For a review, see, for instance, P. Blood and J. W. Orton, *Reports on Progress in Physics*, Vol. 41, pp. 157–257, (1978).

Among semiconductor material charactrization and measurement techniques, the noncontacting techniques are of special interest, since, inter alia, they permit acquisition of the pertinent information without causing any damage to the sample. As the size of individual semiconductor components, e.g., of a transistor in an integrated circuit, decreases and, on the other hand, the number of components on a single semiconductor chip increases, this capability becomes increasingly more important. Furthermore, noncontacting measurement techniques are typically simpler to automatize than contacting ones, and thus can be expected to play an increasingly prominent part in future automated VLSI (very large scale integration) production lines. For a review of noncontacting semiconductor test methods, see, for instance, G. L. Miller et al, *Proceedings of the Topical Conference on Characterization Techniques for Semiconductor Materials and Devices*, The Electrochemical Society, Inc., pp. 1–31, (1978), incorporated herein by reference.

Perhaps the most basic characteristic of semiconductor material for device application is its conductivity type, i.e., the polarity of the majority carriers. The conductivity of a sample can be either n-type, i.e., the majority carriers are electrons, or p-type, i.e., the majority carriers are holes. Since typically semiconductor devices depend on local alteration of conductivity type or level, knowledge of the actual conductivity type of a semiconductor wafer, and particularly of the near-surface volume of a semiconductor wafer in which devices are to be formed, prior to the commencement of processing steps such as doping is of great importance. This application is, inter alia, concerned with a method for conductivity type determination, and I will therefore next discuss such methods and related methods that yield, in addition to other information, also information on the conductivity type.

Several known effects can be used to determine the conductivity type of a semiconductor sample. These include the Hall, Seebeck, and Righi-Leduc effects, and the intraband Faraday effect. The forward direction of a p-n junction or Schottky barrier also indicates conductivity type. Of these effects, the Hall effect has probably been used most frequently for conductivity type determination. Hall effect measurements yield, in addition to information on the conductivity type, information on carrier mobility, and require the application of a magnetic field to the sample. For a general review of the Hall effect see, for instance, *The Hall Effect and Related Phenomena*, E. H. Putley, Butterworths, London, (1960).

Hall effect measurements for semiconductor characterization purposes are typically made by means of a four-point probe technique. A noncontacting technique is taught by U.S. Pat. No. 4,190,799, issued Feb. 26, 1980, to G. L. Miller and D. A. H. Robinson, for "Noncontacting Measurement of Hall Effect in a Wafer". The method disclosed in that patent comprises applying an RF voltage to a pair of concentric planar electrodes adjacent to the wafer, thereby capacitively coupling a radical RF current into the wafer. A magnetic field applied normal to the wafer produces a circular component of RF current, which, in turn, produces an axial RF magnetic field which is detected inductively by means of a pick-up coil adjacent to the wafer. This method is truly nondestructive and lends itself to automatization. On the other hand, it requires, for proper implementation, relatively sensitive (and therefore relatively complex) instrumentation.

The Seebeck effect, one of the thermoelectric effects, is the appearance of a voltage between two nonisothermal points of a sample. This effect is used extensively for conductivity type determination in the semiconductor industry, typically by means of a heated probe (or cooled probe) arrangement. See, for instance, John R. Yeager, *Solid State Technology*, Vol. 17(3), March 1974, pp. 14–16, and B. P. Kashnikov, *Instruments and Experimental Techniques*, Vol. 19(2), Part II, March–April 1976, page 575. This technique, in addition to the disadvantages inherent in contacting measurements generally, is subject to problems peculiar to the use of a contact probe at other than room temperature, such as probe oxidation (or frosting), as well as possible temperature-induced sample alteration.

Conductivity type determination by means of rectifying contacts is also well known in the art. See, for instance, H. Hakansson, *The Review of Scientific Instruments*, Vol. 43(9), pp. 1380–1381, (1972). In an exemplary application of this technique, contact is made to the semiconductor sample under test by means of a metal probe, and the conductivity type determined by observing the direction of the rectifying contact thus formed.

As is well known, the carrier concentration in a semiconductor sample can be altered by optical means. This effect, which forms the basis of photovoltaic measurements, can be used to measure minority carrier mobility and/or lifetime, as well as to determine the conductivity type of a semiconductor sample. Capacitive probe photovoltaic measurements of minority carrier diffusion length in semiconductor samples have, for instance, been reported by A. M. Goodman, *Journal of Applied Physics*, Vol. 32(12), pp. 2550–2552 (1961). Although the method requires no conductive contact with the sample, it is nevertheless not a "noncontacting" method. As described by Goodman, a thin transparent insulator with a transparent conductive layer deposited thereon is in physical contact with the illuminated sample surface, forming a parallel-plate probe capacitor with the sample. A reference capacitor is formed on the reverse sample side. The differential voltage between probe and reference capacitor is applied to a high input impedance preamplifier, the output of which is further amplified and then synchronously detected.

Use of the thin spacing-maintaining insulating layer between sample and electrode makes possible the formation of a relatively stable parallel plate probe capacitor of small plate spacing. Plate spacing stability is of importance since unwanted variations of spacing will add noise to the measurement, and small plate spacing is important since the signal amplitude is proportional to the inverse of the spacing. Such an experimental arrangement, in addition to requiring physical contact to the illuminated sample region, with the attendant previously mentioned disadvantages thereof, is also not well suited to studying the effects of changes of, e.g., variation of sample temperature or chemical ambient on the minority carriers. For instance, temperature changes typically cause a change of the dielectric properties of the capacitor dielectric, and the dielectric films tend to shield the underlying sample surface from exposure to the ambient atmosphere. However, such measurements are of considerable interest, since they can, inter alia, supply information on electronic surface states. We will refer to measurements of this type generically as "surface state spectroscopy".

A method similar to that described by Goodman (ibid) forms the basis of the standard test method for minority carrier diffusion length in Si, ASTM F391-78. See, for instance, 1981 *Annual Book of ASTM Standards*, Part 43, pp. 795–801, American Society for Testing and Materials, Philadelphia.

A method and apparatus for the contactless monitoring of carrier lifetime in semiconductor materials is disclosed in U.S. Pat. No. 4,286,215, issued Aug. 25, 1981, to G. L. Miller. The method disclosed in the patent comprises coupling the semiconductor sample into an LC resonant circuit which is the frequency-determining portion of a marginal oscillator adapted, typically, to maintain a constant amplitude RF voltage signal, and measuring the current required to maintain the signal constant. This current is related to the sample's conductivity, and, by illuminating the sample with light of appropriate wavelength, the conductivity of the sample can be modulated. The difference in the steady-state values of conductivity in the illuminated and the dark condition is proportional to the minority carrier lifetime.

As can be seen from the above discussion, currently available techniques for conductivity type determination in semiconductor samples typically either require contacting the sample surface under investigation, e.g., the heated probe technique, or yield more than the sought information at the expense of added apparative complexity, e.g., the noncontacting Hall effect technique. Currently available photovoltage measurement techniques typically also require physical contact with the sample surface under investigation, and typically are not well suited for carrying out surface state spectroscopy.

Because of the great importance of conductivity-type determination in semiconductor device manufacture a simple noncontacting, and thus completely nondestructive, technique therefore is of considerable commercial interest. In particular, such a technique that is easily adaptable to full automation and that can be used, if so desired, for routine monitoring of the conductivity type of the semiconductor wafers in a VLSI production line would fill a gap in available semiconductor material characterization techniques. And a simple noncontacting photovoltaic surface state spectroscopy technique applicable to a wide variety of experimental conditions would be of considerable scientific and technological interest.

DEFINITIONS

Figure 1:
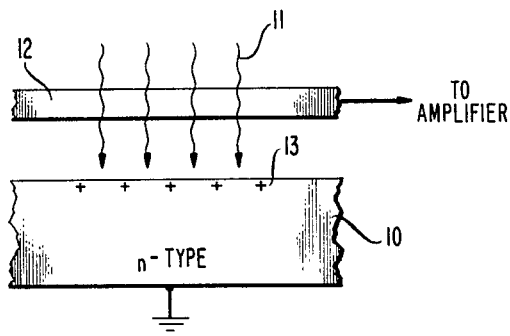
FIG. 1 schematically illustrates the capacitive detection of a photovoltage on an n-type semiconductor sample.

The following terms are used herein as defined below.

"Above-bandgap radiation" is electromagnetic radiation of energy $h\nu$ ($\nu$ is the frequency of the radiation, and h is Planck's constant) greater than the bandgap energy $E_g$ of the semiconductor under investigation. Such radiation is able to excite electrons from the valence band to the conduction band of the given semiconductor.

A "noncontacting" method is a method that requires no physical contact at least to the surface region under investigation, i.e., in the instant case to the surface region illuminated with above-bandgap radiation.

Two parts or devices are "conductively" connected if a relatively low resistance direct current (dc) path exists between them. In the instant context, I consider a dc path having less than about 100$\Omega$ resistance to be a "relatively low resistance" path.

An "operational amplifier (OA)" is an electronic amplifier that is designed to be used with external transfer characteristic-modifying circuit elements. It is typically a high gain differential dc amplifier, and at least one of the external circuit elements is typically connected between one of the input terminals and the output terminal, thereby providing external feedback.

By "OA terminals", I mean the signal input terminals, typically the inverting input terminal, and the output terminal, of an operational amplifier.

An "operational transconductance amplifier (OTA)" is an operational amplifier having a high output impedance, and a transconductance that is proportional to an amplifier bias current.

SUMMARY OF THE INVENTION

Disclosed is a method for capacitive, preferably noncontacting, determination of the conductivity type of a semiconductor sample, typically a wafer, or of a part thereof, e.g., of an epitaxial layer on a semiconductor substrate. The method comprises illuminating the sample surface, or a region of the surface, with above-bandgap radiation, amplitude modulated at a reference frequency, typically in or near the kilohertz range, thereby producing a time-varying minority carrier surface charge density. The method also comprises placing a probe electrode in close proximity to the illuminated surface region, typically without any spacing-maintaining dielectric between electrode and sample, thereby forming a parallel plate capacitor with the sample surface. The time-varying surface charge density induces a similarly varying charge density on the probe electrode, causing a time-varying voltage to appear across the capacitor. The phase of a signal related to this voltage is compared by phase-comparing means, e.g., a dual trace oscilloscope, or a phase-sensitive detector such as a lock-in amplifier, to the phase of a reference signal at the reference frequency and having a substantially fixed phase relation with the periodic amplitude variation of the illuminating radiation. The conductivity type of the sample can be deduced from the result of the phase comparison.

Disclosed is also a related method for measuring the time-varying surface potential in a semiconductor sample that can advantageously be used in surface state spectroscopy. The time-varying surface potential is produced by illumination of the surface as described above, and a signal that is related to the surface potential is picked up by means of an electrode of the type described above. The electrode is conductively connected to an operational amplifier terminal, preferably the inverting input terminal of an OA, and a reference point, typically a guard electrode or a part of the sample surface that is substantially unilluminated by the above-bandgap illumination, is conductively connected to another OA terminal, preferably the output terminal. Charge-equalizing means connected between the OA input and the output terminals, e.g., a resistor or appropriate active electronic means, are provided. This arrangement of external elements, referred to as an electronic integrator since, as in the standard operational amplifier integrator, the capacitor formed by the sample/electrode combination is in the feedback path of the operational amplifier, can yield an amplifier output signal that is substantially proportional to the time-varying surface potential and substantially independent of the sample/electrode distance.

The signal in the inventive method for conductivity type determination can also be made substantially independent of sample/electrode spacing by using as preamplifier, prior to the phase comparison, an operational amplifier integrator in an arrangement similar to that discussed above, and this is a preferred embodiment of the invention.

The inventive method for conductivity type determination is easily implemented, requires no physical contact to the sample surface under investigation, can be easily automated, and can, by proper choice of the wavelength of the illuminating radiation, give information on the conductivity type of a thin layer of material, of the order of 1 μm thick. This sensitivity to a thin layer of material is of considerable advantage, since it permits, inter alia, determination of the conductivity type of a thin epitaxial layer of semiconductor material on a semiconductor substrate.

The inventive method for measuring the time-varying surface potential of a semiconductor sample is closely related to the inventive conductivity type determination method. It is particularly adapted to surface state spectroscopy, e.g., determination of the effect of changes in ambient condition (e.g., temperature, chemical) on minority carrier properties and on electronic surface states, since no physical contact to the sample surface under investigation is required.

DETAILED DESCRIPTION

Photovoltaic measuring techniques, including the inventive methods, require illuminating a surface of the semiconductor sample under investigation with amplitude modulated, typically chopped or square-wave modulated, above-bandgap radiation, typically of energy only slightly greater than the bandgap energy of the semiconductor. Minority carriers are thereby produced in the sample and diffuse to the surface, where they produce a change in the surface charge density, or, in other words, a change in the surface potential.

This is schematically illustrated in FIG. 1, in which a sample of n-type semiconductor 10 is illuminated with above-bandgap radiation 11, resulting in accumulation of minority charge carriers (in the instant case these are holes) at the sample surface, indicated by means of plus-signs 13. Placing a conductor, exemplified by plane probe electrode 12, in close proximity to the illuminated surface region results in the appearance of a corresponding signal on the conductor, which can be detected by electronic means, e.g., by means of a lock-in amplifier synchronized with the periodically amplitude modulated illuminating radiation.

The probe electrode comprises advantageously a thin transparent layer of electrically conductive material, e.g., indium tin oxide, since this permits convenient illumination of the surface region directly opposite of the electrode. For practical reasons, the transparent conductive layer typically is formed on a transparent substrate, e.g., a glass plate. The term "transparent" is understood to mean "substantially transparent to the above-bandgap radiation used". Since it is typically advantageous to expose the sample region under investigation to spatially substantially uniform radiation, beam-limiting means, e.g., an optical aperture, are advantageously interposed between light source and probe electrode. Spatially uniform intensity is particularly advantageous in surface state spectroscopy.

Since the absorption length of above bandgap radiation in a semiconductor depends on the wavelength of the radiation as well as on the semiconductor, the thickness of the semiconductor volume in which pair creation takes place can be varied by varying the radiation wavelength. The sampled thickness can thus be controlled, permitting, for instance, use of the inventive method on samples having a layer structure, e.g., a thin layer of epitaxial semiconductor on a substrate. Data on penetration depth is readily available. See, for instance, S. M. Sze, *Physics of Semiconductor Devices*, 2nd edition, J. Wiley & Sons, (1981), pp. 750–751. It is to be understood that use of the term "illuminate" is not meant to imply a restriction to visible radiation, and radiation with shorter or longer than visible wavelengths may be advantageously used in appropriate circumstances.

Any appropriate radiation source having the required intensity and bandwith can be used in the practice of the inventive methods. For suggested characteristics, see, for instance, ASTM Standard F391-78 (op. cit.). As stated there, broadband sources such as a 35 W tungsten lamp can be used in conjunction with narrow-banding means, e.g., filters or a monochromator. Solid state light sources such as light emitting diodes (LEDs) can advantageously be used. For instance, a GaAsP diode emits red light which has about 1 μm absorption depth in Si and thus can advantageously be used as a source of above-bandgap radiation for type-determination of a thin layer of epitaxial Si.

Solid state sources typically can be modulated at the reference frequencies of interest in the practice of the invention, i.e., typically between a fraction of a kilohertz to a few hundred kilohertz. Continuously emitting sources such as an incandescent lamp typically require use of some light chopping device. Amplitude modulating means, including square wave modulating means, are well known in the art and will not be discussed further.

Light sources, especially pulsed sources, may contribute noise to the measurement unless steps are taken to prevent this. An electrostatic shield interposed between light source and experimental apparatus, including the sample, probe electrode and signal pre-amplifier, typically improves the signal-to-noise ratio of a measurement.

Figure 2:
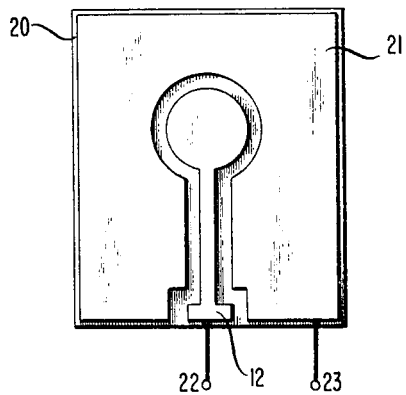
FIG. 2 shows schematically an exemplary electrode arrangement useful in the practice of the instant invention.

FIG. 2, in which, as is the case for all the figures herein, like parts in different figures are designated by like reference numerals, shows schematically in top view a patterned layer of transparent conducting material on a transparent substrate 20. Patterning, for instance by means of photolithography and etching, is used to produce two electrically separate regions, namely, probe electrode 12, and guard electrode 21. Contact points 22 and 23 permit making electrical contact to 12 and 21, respectively. The electrode arrangement shown in FIG. 2 is exemplary only, and other possible capacitive pick-up arrangements will be apparent to those skilled in the art. For instance, the guard electrode 21 need not be transparent, and a metal layer guard electrode can be advantageously used.

Figure 3:
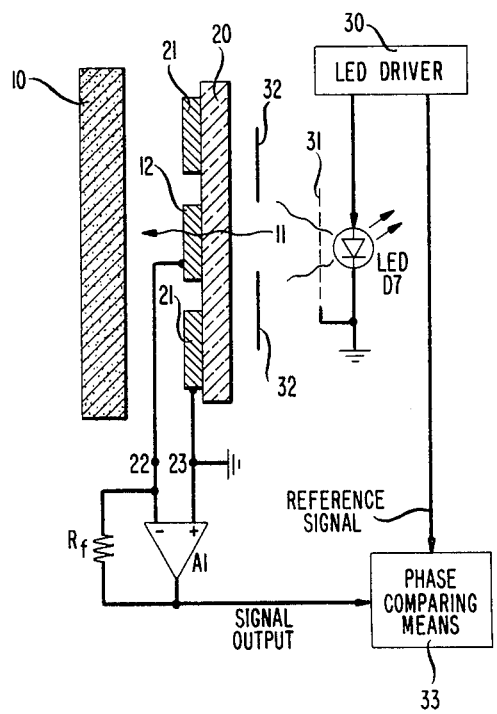
FIG. 3 schematically depicts an embodiment of the inventive method for conductivity type determination.

FIG. 3 schematically depicts an exemplary embodiment suitable for determining the conductivity type of a semiconductor sample. Above-bandgap radiation 11 is emitted by LED D7, for instance a GaAsP LED, driven by LED driver 30, which supplies a reference frequency drive current, sufficient to cause emission of amplitude modulated radiation, to D7. Electrostatic shield 31 is advantageously interposed between the radiation source and the sample and signal amplifier. Radiation limiting means 32, e.g., an aperture, to serve to restrict the illumination substantially to a sample surface region no larger than probe electrode 12, thus substantially preventing illumination of any sample surface opposite guard electrode 21. A voltage difference, varying at the reference frequency, appears between contact points 22 and 23, and the phase of this signal is to be compared to the phase of the reference signal. This can be done, for instance, by amplifying the signal as indicated in FIG. 3, namely, by conductively connecting probe electrode 12 to the inverting input terminal of operational amplifier A1, grounding guard electrode 21 (the "reference point" in this configuration) and the noninverting input of A1, connecting feedback resistor $R_f$ between the inverting input terminal and the output terminal of A1, and connecting input terminal and synchronization terminal of phase-comparing means 33, e.g., of a dual-beam oscilloscope or a lock-in amplifier, to the output terminal of A1 and to the reference signal terminal of the LED driver, respectively.

Figure 4:
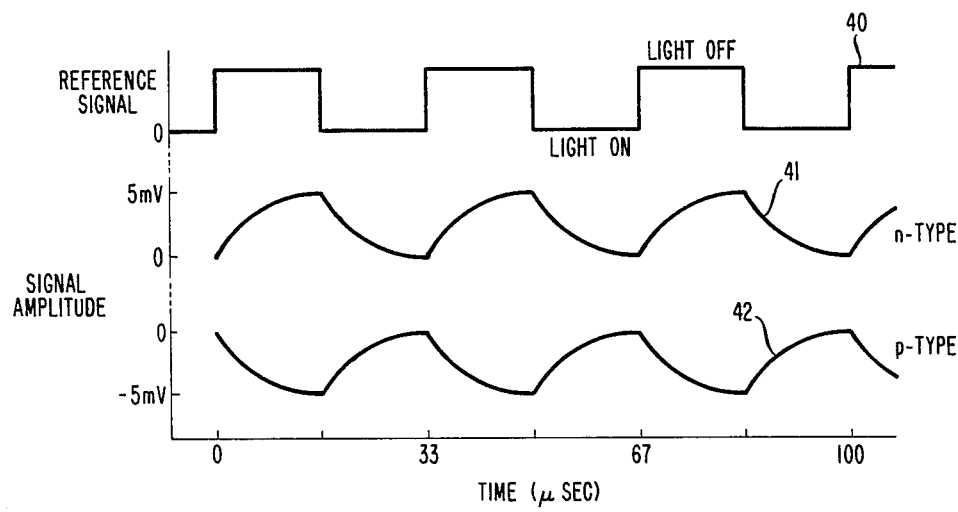
FIG. 4 schematically shows exemplary signal waveforms observed with an arrangement for the practice of the inventive method similar to that shown in FIG. 3.

FIG. 4 shows schematically the signals observed with an arrangement similar to that shown in FIG. 3. Curve 40 is the reference signal, as observed, for instance, on an oscilloscope screen. Curve 41 is the signal obtained from a P-doped Si sample (n-type, about $10^{16}$ carriers/cm$^3$), and 42 the signal from a B-doped Si sample (p-type, about $10^{16}$ carriers/cm$^3$), as displayed on an oscilloscope screen. Amplifier A1 used to obtain these signals was an RCA CA-3140 operational amplifier, the feedback resistor was 47 MΩ, and the reference frequency was about 30 kHz, with the LED drive current being substantially square 40 mA pulses of about 50% duty cycle. The signal from the n-type sample is substantially in phase with the reference signal, whereas the signal from the p-type sample is substantially 180° out of phase with the reference signal. This permits easy determination of the conductivity type.

The above phase difference is due to the fact that in an n-type sample, holes accumulate at the semiconductor surface upon illumination thereof, thereby producing a positive signal on the probe electrode, whereas in a p-type sample, electrons accumulate at the surface, producing a negative signal on the electrode.

Figure 5:
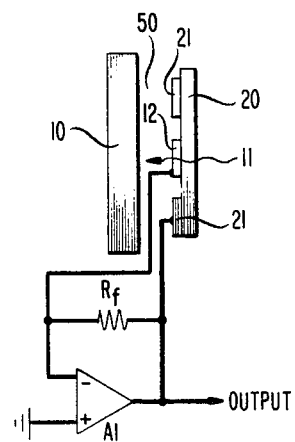
FIG. 5 schematically shows a further embodiment of the inventive method, namely, the "integrator" arrangement in which the probe capacitor is in the feedback loop of an operational amplifier.

FIG. 5 schematically shows the archetype of a preferred embodiment of the invention that can advantageously be used for conductivity type determination as well as for surface state spectroscopy. Conductive contact is made between guard electrode 21 (the "reference point" in this configuration) and the output terminal of operational amplifier A1, and between probe electrode 12 and the inverting input terminal of A1, with the noninverting terminal of A1 being grounded. Feedback resistor $R_f$, also connected between output and inverting input terminal of A1, serves to determine, together with the capacitance C1 of the air capacitor primarily formed by sample 10 and probe electrode 12, the time constant of the integrator formed by this combination of components, and to restore the dc level of the loop. It thus is an example of "charge-equalization" or "dc-level restoring" means. The output of A1 can be observed on an oscilloscope, be phase-sensitively detected, or be further electronically processed, according to the requirements of the measurement, similar to the manner shown in FIG. 3.

The output signal of A1 is substantially independent of the value of C1, i.e., of the spacing between the sample surface and the probe electrode, since the output voltage moves to cancel the surface voltage change, in order to maintain the inverting input terminal at virtual electrical ground level. The product $R_fC1$, the integrator time constant, should preferably be made much greater than the modulation period of the illuminating radiation. Since C1 typically is small, this condition requires that $R_f$ be large, typically in the megohm range.

Figure 6:
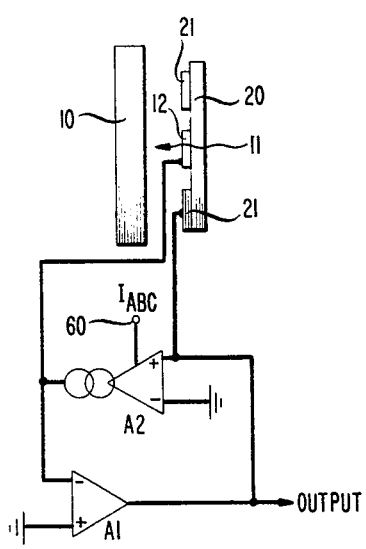
FIG. 6 schematically shows an advantageous variant of the integrator arrangement in which an active device replaces the feedback resistor.

FIG. 6 schematically depicts an embodiment in which the place of the passive charge equalizing means (resistor $R_f$) of FIG. 3 is taken by active, electronically gated, equalizing means. In particular, (OTA) A2, which can be switched on and off by means of gating current $I_{ABC}$, injected into OTA control terminal 60, serves to accurately dc-restore the feedback loop of A1. This can be accomplished, for instance, by pulsing $I_{ABC}$ "on" for a few percent of the radiation modulation period at each high/low transition of the radiation source. DC-restoring means of this type have been disclosed and briefly discussed by G. L. Miller et al, Pro-

*ceedings of the 2nd ISPRA Nuclear Electronics Symposium,* Stresa, Italy, May 1975, Commission of the European Communities, Directorate, General Scientific and Technical Information, KUR 5370e, pp. 9-19, especially FIG. 4.2 and page 14 thereof.

Figure 7:
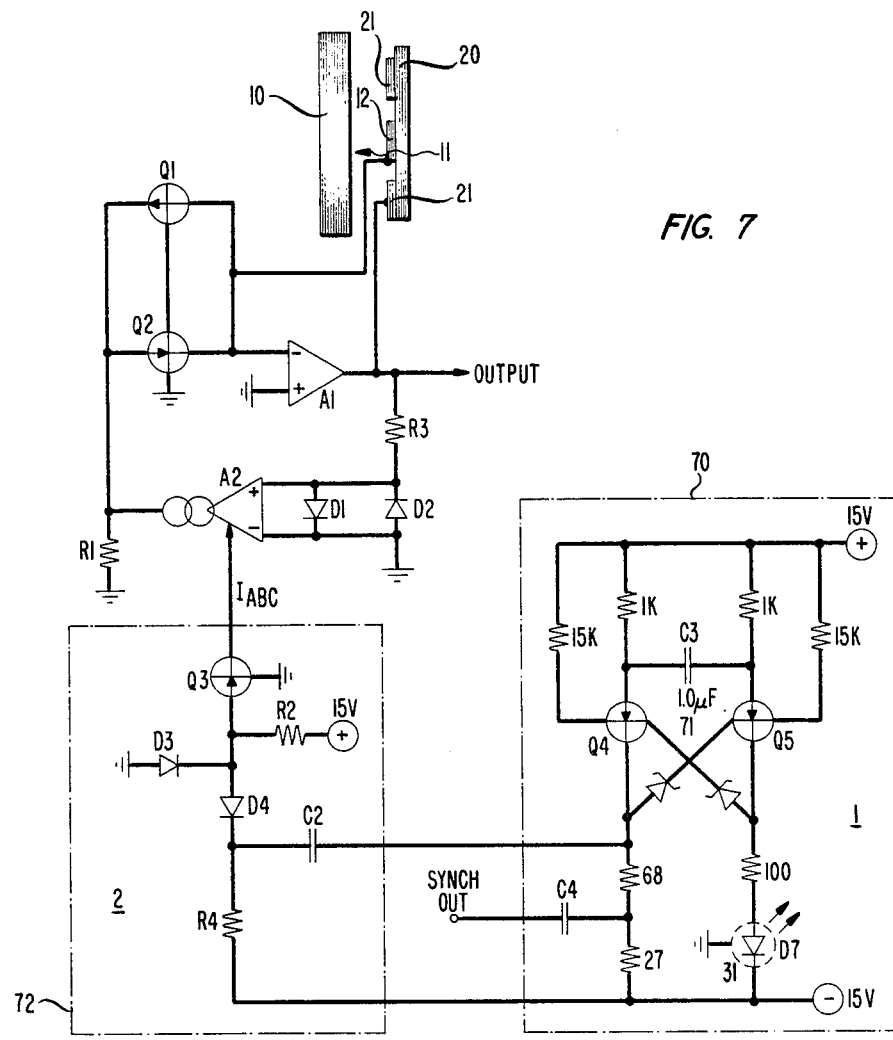
FIG. 7 shows in greater detail a circuit useful for the practice of the above variant of the integrator arrangement.

FIG. 7 shows a circuit diagram of an exemplary circuit developed and constructed for the practice of the inventive method. In particular, the circuit is an example of an integrator with active dc level-restoring means of the type schematically depicted in FIG. 6. Box 1, outlined by dashed line 70, contains emitter-coupled multivibrator 71. The multivibrator provides the essentially square-wave modulated current for driving LED D7, which emits the above-bandgap radiation for illuminating the sample. Box 1 also contains the resistors and capacitor C4 for providing a reference signal for synchronization of, e.g., a phase-sensitive detector. Employing components of the indicated values, the multivibrator produces a substantially square wave (50% on) drive current to the LED, with "on" current of about 40 mA, and an "off" current of about 1.4 mA. Providing a small "off" current typically results in reduced LED voltage excursion. Emitter-coupled multivibrators are well known in the art, and require no further discussion. Box 1 also contains schematically represented grounded electrostatic shield 31, interposed between D7 and the sample and measurement electronics.

Box 2, outlined by dashed line 72, contains the components for providing gating current $I_{ABC}$ to gated OTA A2. The resistance value of R2 substantially determines the magnitude of $I_{ABC}$, and that of the product R4C2 substantially the length of the current gating pulse that is provided to A2 at every on-to-off transition of LED D7. For proper operation, it is necessary that R2 be greater than R4.

A2 serves to restore the dc-level of the feedback loop of integrating operational amplifier A1. An exemplary choice for A2 is an OTA of designation RCA CA-3080, and a possible choice for A1 is an operational amplifier designated RCA CA-3140. However, other amplifiers can be used instead of the indicated ones. Transistors Q1, Q2 and resistor R1 are provided to remove the effect of any "off" leakage current of A2, and may not be needed if this leakage is low enough.

Figure 8:
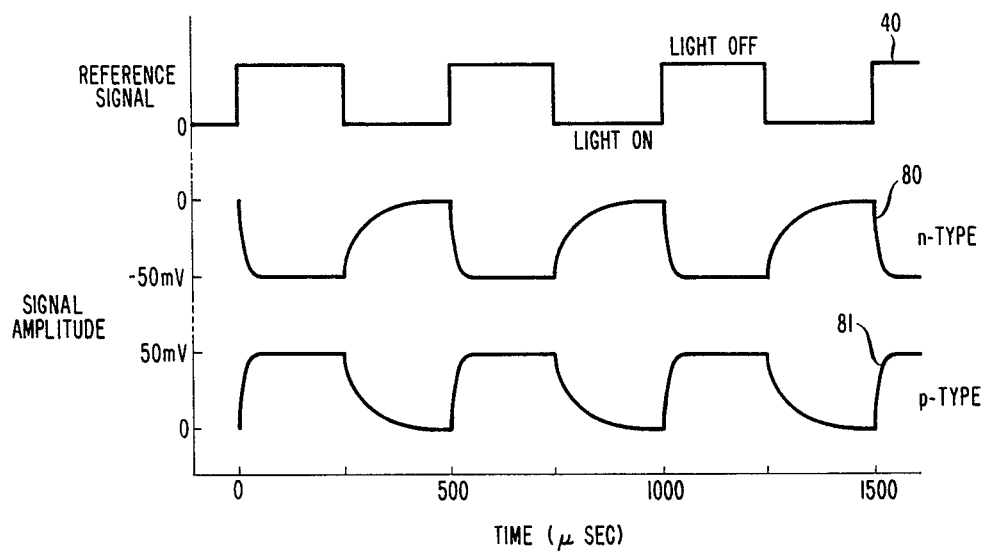
FIG. 8 schematically shows exemplary signal waveforms observed with an arrangement for the practice of the invention similar to that shown in FIG. 7.

FIG. 8 schematically shows the signals observed with an arrangement similar to that shown in FIG. 7. Curve 40 is the reference signal as observed by connecting the "synchronization out" terminal of FIG. 7 to an oscilloscope. Curve 80 is the signal obtained from a P-doped Si sample (about $10^{16}$ carriers/cm$^3$), and 81 the signal from a B-doped Si sample (about $10^{16}$ carriers/cm$^3$). The signal obtained from the n-type sample is now substantially 180° out of phase with the reference signal, and the signal from the p-type sample is substantially in phase with the reference signal. This again allows easy determination of the conductivity type of the sample. The amplitude of the observed signal depends substantially only on the amplitude of the change in surface charge density, and is substantially independent of changes in C1. Since, due to the properties of the OTA A2, the effective integrator time constant is long, the signal shape faithfully reproduces the actual surface potential. A system as shown FIG. 7, or similar systems, can advantageously be used for surface state spectroscopy.

The embodiments of the invention represented by FIGS. 3, 5, 6 and 7 are preferred, since they require no conductive contact with the sample. However, the invention can also be practiced in other ways as will be apparent to those skilled in the art. For instance, the method can be practiced by conductively connecting an OA terminal of A1 in FIGS. 3, 5, 6 and 7 to a substantially unilluminated sample region, e.g., the back of the wafer under investigation, making this sample region the "reference point". Furthermore, it is possible to utilize other input configurations that the preferred one shown in FIGS. 5, 6, and 7. For instance, the pick-up electrode can be connected to the output terminal of the OA, and the reference point to the inverting input terminal. When using such a connection scheme the polarity of the observed signal will be the reverse of that shown in FIG. 7.

What is claimed is:

1. A method for determination of a time-varying surface potential produced in a sample of semiconductor material, the method comprising
   (a) providing a source of above-bandgap amplitude modulated electromagnetic radiation, the amplitude varying periodically at a reference frequency;
   (b) placing an electrode in proximity to, but spaced apart from, a surface of the sample, the electrode comprising a first electrode region and a second electrode region, at least the first electrode region being substantially transparent to the radiation, the first electrode region being conductively isolated from the second electrode region;
   (c) irradiating, through the first electrode region, a part of the sample surface with the radiation, whereby the surface potential of the part of the sample surface is caused to vary at the reference frequency, substantially all of the irradiated surface part directly facing the first electrode region and substantially none of the irradiated surface part directly facing the second electrode region; and
   (d) providing a differential electronic amplifier, conductively connecting the first electrode region to an amplifier input terminal, conductively connecting the second electrode region to an amplifier output terminal, and providing means for charge equalization between the amplifier input terminal and the amplifier output terminal.

2. Method of claim 1, wherein the electrode and the sample are maintained spaced apart, with no spacing-maintaining dielectric therebetween.

3. Method of claim 1, wherein the differential electronic amplifier constitutes at least a part of electronic integration means having a time constant that is longer than $f_R^{-1}$, where $f_R$ is the reference frequency.

4. A method for capacitive conductivity type determination of at least a part of a sample of semiconductor material, the method comprising
   (a) providing a source of above-bandgap amplitude modulated electromagnetic radiation, the amplitude varying periodically at a reference frequency;
   (b) placing an electrode in proximity to, but spaced apart from, a surface of the sample, the electrode comprising a first electrode region and a second electrode region, at least the first electrode region being substantially transparent to the radiation, the first electrode region being conductively isolated from the second electrode region;
   (c) irradiating, through the first electrode region, a part of the sample surface with the radiation, whereby the surface potential of the part of the sample surface is caused to vary at the reference frequency, substantially all of the irradiated surface part being directly facing the first electrode region and substantially none of the irradiated part being directly facing the second electrode region;

(d) providing, by conductive connection to the first electrode region, an electrical signal that is varying at the reference frequency, and, by conductive connection to the second electrode region, a reference voltage;

(e) providing a reference signal having substantially fixed phase relationship with the periodic amplitude variation of the radiation; and (f) comparing the phase of the difference between the signal and the reference voltage to the phase of the reference signal, thereby determining the conductivity type.

5. Method of claim 1 or 4, wherein the semiconductor sample is substantially disc-shaped, such sample being referred to as a wafer.

6. Method of claim 5, wherein the wafer is a silicon wafer.

7. Method of claim 5, wherein the wafer comprises epitaxially grown semiconductor material.

8. Method of claim 1 or 4, wherein the amplitude modulated radiation is substantially square wave modulated, with the radiation being substantially off during a part of each cycle.

9. Method of claim 8, wherein the radiation is emitted by a light emitting diode.

10. Method of claim 9, wherein an electrostatic shield is placed between the light emitting diode and at least the sample.

11. Method of claim 1 or 4, wherein the substantially transparent first electrode comprises indium tin oxide.

12. Method of claim 4, wherein, prior to step (f), the signal is electronically processed by means comprising an electronic amplifier.

13. Method of claim 12, wherein the electronic processing comprises providing the signal to electronic integration means having a time constant that is longer than $f_R^{-1}$, where $f_R$ is the reference frequency.

14. Method of claim 13, wherein the electronic integration means comprise an operational amplifier having at least an inverting and a noninverting input and an output port, with the electrical signal provided to the reversing input port, the reference signal is provided to the output port, and the noninverting input port is grounded.

15. Method of claim 4, wherein the electrode and the sample are maintained spaced apart, with no spacing-maintaining dielectric therebetween.

* * * * *